(12) United States Patent
Nakashima et al.

(10) Patent No.: US 8,747,633 B2
(45) Date of Patent: Jun. 10, 2014

(54) TANTALUM SPUTTERING TARGET AND METHOD FOR MANUFACTURING THE SAME, AND METHOD FOR MANUFACTURING SEMICONDUCTOR ELEMENT

(75) Inventors: Nobuaki Nakashima, Yokohama (JP); Yoshiki Orimoto, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 13/470,800

(22) Filed: May 14, 2012

(65) Prior Publication Data

US 2012/0267236 A1    Oct. 25, 2012

Related U.S. Application Data

(63) Continuation of application No. PCT/JP2010/006482, filed on Nov. 4, 2010.

(30) Foreign Application Priority Data

Nov. 17, 2009    (JP) .............................. P2009-262103

(51) Int. Cl.
| | | |
|---|---|---|
| *C23C 14/14* | (2006.01) | |
| *C22C 27/02* | (2006.01) | |
| *C22F 1/18* | (2006.01) | |
| *C23C 14/34* | (2006.01) | |

(52) U.S. Cl.
USPC ...... 204/298.13; 148/422; 148/668; 420/427; 204/192.1

(58) Field of Classification Search
USPC .................. 204/192.1, 298.13; 148/668, 422; 420/427
See application file for complete search history.

(56) References Cited

U.S. PATENT DOCUMENTS

| | | | |
|---|---|---|---|
| 6,893,513 B2 * | 5/2005 | Michaluk et al. | 148/422 |
| 2005/0268999 A1 | 12/2005 | Oda | |
| 2007/0023281 A1 * | 2/2007 | Oda | 204/298.12 |
| 2007/0102288 A1 | 5/2007 | Oda et al. | |
| 2007/0240795 A1 | 10/2007 | Sato et al. | |

FOREIGN PATENT DOCUMENTS

| | | |
|---|---|---|
| EP | 0 902 102 A1 | 3/1999 |
| JP | 11-080942 A | 3/1999 |
| JP | 2004-162117 A | 6/2004 |
| JP | 3898043 B2 | 1/2007 |
| JP | 2007-302996 A | 11/2007 |
| WO | WO 2004/090193 A1 | 10/2004 |

* cited by examiner

*Primary Examiner* — Jessee Roe
(74) *Attorney, Agent, or Firm* — Foley & Lardner LLP

(57) ABSTRACT

In one embodiment, a method for manufacturing a tantalum sputtering target includes a first knead forging step, a first heating step, a second knead forging step, a cold rolling step, and a second heating step. In the first knead forging step, a tantalum material is subjected to two sets or more of knead forging, each of the sets being cold forging in directions parallel to and perpendicular to a thickness direction. In the second knead forging step, one set or more of knead forging is performed after the first heating step, each of the steps being cold forging in the directions parallel to and perpendicular to the thickness direction.

5 Claims, 2 Drawing Sheets

TANTALUM SPUTTERING TARGET AND METHOD FOR MANUFACTURING THE SAME, AND METHOD FOR MANUFACTURING SEMICONDUCTOR ELEMENT

CROSS-REFERENCE TO RELATED APPLICATIONS

This application is a continuation of prior International Application No. PCT/JP2010/006482, filed on Nov. 4, 2010 which is based upon and claims the benefit of priority from Japanese Patent Application No. 2009-262103 filed on Nov. 17, 2009; the entire contents of all of which are incorporated herein by reference.

FIELD

Embodiments described herein relate generally to a tantalum sputtering target and a method for manufacturing the same, and a method for manufacturing a semiconductor element.

BACKGROUND

In recent years, as semiconductor elements become more highly integrated, metallic interconnect lines of Al, Cu, and the like have become narrower in width. This has given rise to a demand for improvement in an electromigration property. In order to improve the electromigration property, it is desirable that in crystal growth of wiring metal after the deposition, the densest surface of crystals of the metal grows in a pillar shape, and for this, it is desirable that the sputtering is performed so that a densest surface of a barrier film of TiN, TaN, or the like formed under the wiring metal also becomes in a pillar shape.

When a Cu interconnect line is used, its barrier film is most suitably a TaN (tantalum nitride) film. The TaN film is obtained through deposition using a high-purity Ta sputtering target in a nitride atmosphere. To perform sputtering so that the densest surface of the barrier film becomes in the pillar shape requires miniaturizing a crystal grain size of target metal and making crystal orientation random. Further, in order to improve uniformity of a sputtered film, residues of a cast structure (ghost grains) have to be eliminated.

In the manufacture of a Ta sputtering target, it has been conventionally known that an ingot is subjected to cold upset forging after subjected to cold side forging. The side forging is a process to apply a pressure to a columnar ingot in its diameter direction. Further, the upset forging is a process in which the ingot extended in its longitudinal direction by the side forging is worked in the longitudinal direction into a thin plate. The both are processes to cause plastic deformation by applying a pressure in a fixed direction. However, when an average crystal grain size becomes microscopic, the plastic deformation only by the pressure in the fixed direction is likely to cause crystal orientation to be in a specific direction.

In the manufacture of the Ta sputtering target, cold knead forging has been known. The knead forging is a working method of plastically deforming an ingot by alternately applying pressures in its thickness direction and diameter direction. The successive application of the pressures in the thickness direction and the diameter direction decreases the likelihood of the occurrence of specific crystal orientation. When a Ta sputtering target having a microcrystalline structure with a 50 μm average crystal grain size or less is manufactured, uniform random orientation cannot be necessarily obtained in the thickness direction even if uniform random orientation is obtained on a sputtered surface. This has a problem that a uniform film cannot be obtained in the long-time sputtering due to a disadvantage such as variation in a sputtering rate.

DETAILED DESCRIPTION

According to one embodiment, a method for manufacturing a tantalum sputtering target includes a first knead forging step, a first heating step, a second knead forging step, a cold rolling step, and a second heating step. In the first knead forging step, a tantalum material made of a columnar tantalum ingot or billet is subjected to two sets or more of knead forging, each of the sets being cold forging in directions parallel to and perpendicular to a thickness direction. In the first heating step, recrystallization is caused at a 1000° C. temperature or higher after the first knead forging step. In the second knead forging step, one set or more of knead forging is performed after the first heating step, each of the sets being cold forging in the directions parallel to and perpendicular to the thickness direction. In the cold rolling step, cold rolling is performed after the second knead forging step. In the second heating step, heating at a 900° temperature or higher is performed after the cold rolling step.

Hereinafter, embodiments will be described. A method for manufacturing a tantalum sputtering target of an embodiment includes a first knead forging step, a first heating step, a second knead forging step, a cold rolling step, and a second heating step.

In the first knead forging step, a tantalum material made of a columnar tantalum ingot or billet is subjected to two sets or more of knead forging, each of the sets being cold forging in directions parallel to and perpendicular to a thickness direction. In the first heating step, recrystallization is caused at a 1000° C. temperature or higher after the first knead forging step.

In the second knead forging step, one set or more of knead forging is performed after the first heating step, each of the sets being cold forging in the directions parallel to and perpendicular to the thickness direction. In the cold rolling step, cold rolling is performed after the second knead forging step. In the second heating step, heating at a 900° temperature or higher is performed after the cold rolling step.

Figure 1:
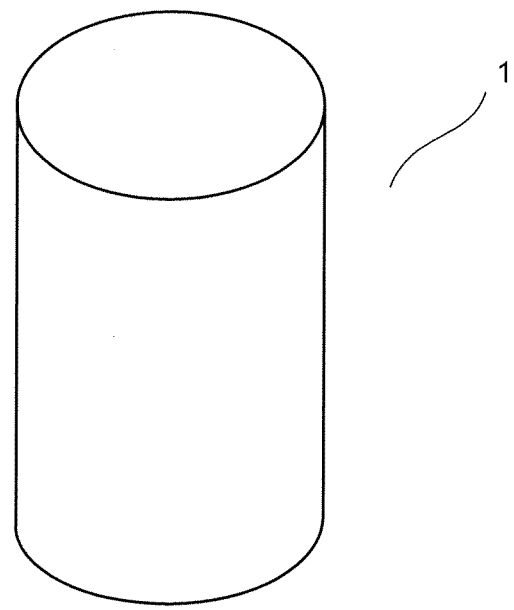
FIG. 1 is an exterior view showing an example of a columnar tantalum material of an embodiment.
Figure 2:
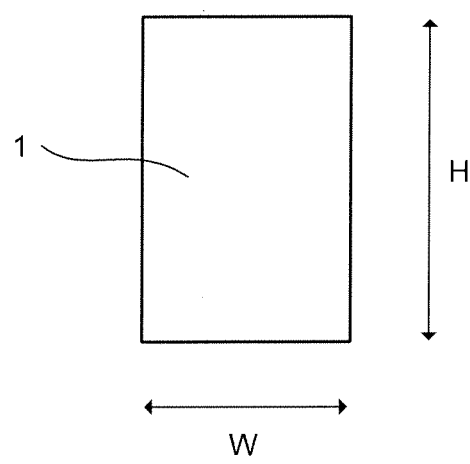
FIG. 2 is a plane view showing an example of the columnar tantalum material of the embodiment seen from a lateral direction.

The tantalum material made of the columnar tantalum ingot or billet has a columnar shape as shown in FIG. 1, for instance. FIG. 2 shows a thickness H and a diameter W of the columnar tantalum material. The size of the columnar tantalum material is not particularly limited, but one whose thickness H is about 20 to 200 mm and diameter W is about 100 to 300 mm is easy to handle.

The tantalum material is preferably one with a 99.99% tantalum purity or more (4N or more) that is highly purified by forging such as an EB melting method. This is because purity of a tantalum target depends on the purity of the tantalum material. For example, when a tantalum target with a 99.999 wt % purity or more (5N or more) is necessary, a tantalum material with a 99.999 wt % purity or more is used.

Such a columnar tantalum material is subjected to two sets or more of the knead forging, each set being the cold forging in the directions parallel to and perpendicular to the thickness direction. The direction parallel to the thickness direction is a direction of the thickness H, and the direction perpendicular to the thickness direction is a direction of the diameter W. When the knead forging in which forging is performed alternately in the direction of the thickness H and the direction of the diameter W is one set, two sets or more of this are performed.

Applying pressures from different directions, the knead forging can achieve the miniaturization of a crystal grain size and prevent crystal orientation from being biased in a specific direction. It can reduce a cast structure (ghost grains) of the tantalum material manufactured by the forging. The number of times (the number of sets) of the knead forging is preferably larger, but when the number of times is too large, manufacturing cost increases and the material is likely to suffer a crack and wrinkles, and therefore, the number of times of the knead forging is preferably two to four sets.

Vickers hardness Hv of the tantalum material after the first knead forging step is preferably 150 or more. Performing two sets or more of the knead forging realizes uniform texture and increases the hardness of the tantalum material. However, in consideration of later-described manufacturing steps, even if the hardness is less than Hv 150, a higher effect is not obtained, resulting in useless knead forging step. Therefore, in controlling the number of sets of the first knead forging step, it is preferable to perform the knead forging so that the Vickers hardness Hv becomes 150 or more.

Figure 3:
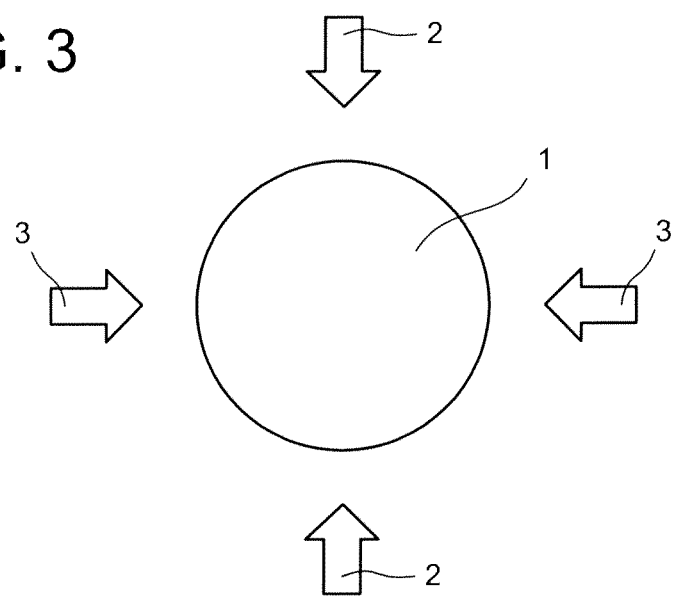
FIG. 3 is a plane view showing an example of the columnar tantalum material of the embodiment seen from an upper direction.

The pressure in the direction of the diameter W does not necessarily have to be constantly in a fixed direction but the directions are preferably changed in the middle. For example, as shown in FIG. 3, it is preferable that directions in which the pressure is applied are changed in such a manner that at the first set, the pressure is applied in a direction 2 and at the second set, the pressure is applied in a direction 3 being a direction perpendicular to the direction 2 in which the pressure is applied at the first set. It is also effective to change the pressure application directions in the middle of the first set. Changing directions also when the pressure is applied in the direction of the diameter W can also attain the effect of achieving the miniaturization of the crystal grain size and preventing the crystal orientation from being biased in a specific direction. Further, the first knead forging is preferably cold forging. Hot forging may possibly cause the occurrence of a surface crack due to oxidation. Further, because crystal grains grow, it might not be possible to obtain a microcrystalline structure with a 50 μm average crystal grain size or less.

The first knead forging step is followed by the first heating step in which the recrystallization is caused at a 1000° C. temperature or higher. By the heating, an internal strain occurring in the columnar tantalum material in the first knead forging step is removed and the recrystallization is caused, which makes it possible to obtain a uniform microcrystalline structure. The heating temperature is preferably 1000 to 1400° C. for one to ten hours. When the heating temperature is over 1400° or when the heating time is over ten hours, grain growth may possibly accompany. A preferable condition is 1100 to 1300° C.×3 to 7 hours. Further, an atmosphere is preferably a vacuum atmosphere with 0.133 Pa or less. This is because, in an oxygen-containing atmosphere, the surface might be oxidized during the heating.

The first heating step is followed by the second knead forging step. Details of the second knead forging itself are the same as those of the knead forging in the first knead forging step, but the number of times of the knead forging may be one set or more and preferably, one to four sets. When it is two sets or more, the directions of the pressure applied in the direction of the diameter W are preferably changed every set. As shown in FIG. 3, the pressure application directions are preferably changed in such a manner that at the first set, the pressure is applied in the direction 2, and at the second set, the pressure is applied in the direction 3 being the direction perpendicular to the direction 2 in which the pressure is applied at the first set. The second knead forging step is also preferably cold forging. The second knead forging can more promote the miniaturization of the crystal grain size.

The second knead forging step is followed by the cold rolling step. The cold rolling is a step of plastically working the columnar tantalum material into a plate shape. When necessary, the cold rolling may be performed twice or more. A plate thickness is reduced to 20 mm or less, preferably 10 to 15 mm by the cold rolling step. The plate thickness adjusted by the cold rolling step is changed to a plate thickness of the sputtering target by cutting. Incidentally, between the second knead forging step and the cold rolling step, a heating step is preferably not performed. The tantalum material unified by the second knead forging step is more preferably cold-rolled as it is.

Working ratios of the first knead forging step, the second knead forging step, and the cold rolling step may be any, but a reduction in area or a reduction in thickness in the knead forging (per one set) or the cold rolling in at least one of the first knead forging step, the second knead forging step, and the cold rolling step is preferably 35% or more. The reduction in area is a reduction ratio of a sectional area in the direction of the diameter W of the columnar tantalum material. The reduction in thickness is a reduction ratio in the direction of the thickness H of the columnar tantalum material. For example, in the first knead forging step, two sets or more of the knead forging are performed. The 35% working ratio or more is a working ratio obtained as a result of performing one set.

The step with the 35% working ratio or more is preferably the cold rolling step. For example, after the first knead forging step→the first heating step→the second knead forging step are performed, the occurrence of the internal strain is easily reduced even if the cold rolling with the 35% working ratio or more is performed. When the working ratio is low, the occurrence of the internal strain can be reduced but it takes too long a time for the manufacture because each step is repeated many times. Therefore, the step with the 35% working ratio or more is preferably performed in some of the steps. Note that an upper limit of the working ratio is preferably 99% or less. Working with a working ratio over 99% in one step is likely to cause the occurrence of an internal strain, a crack, wrinkles, and the like.

More preferably, the working ratio is preferably 35% or more in all of the first and second knead forging steps and the cold rolling step. Note that the working ratio is a working ratio per one set when two sets or more of the knead forging are performed, as described above. The 35% working ratio or more means that at least one of the reduction in area and the reduction in thickness needs to be 35% or more. Especially preferably, the working ratios of the first and second knead forging steps are 35 to 55% and the working ratio of the cold rolling step is 80 to 95%.

The cold rolling step is followed by the second heating step in which the heating is performed at a 900° C. temperature or higher. A heating condition is preferably 900 to 1100°×2 to 5 hours. Further, an atmosphere is preferably a vacuum atmosphere with 0.133 Pa or less. This is because, in an oxygen-containing atmosphere, the surface might be oxidized during the heating. The second heating step can remove the internal strain occurring in the second knead forging step and the cold rolling step and can cause the recrystalization. After the second heating step, the shape is trimmed by cutting such as lathing. Further, a backing plate is bonded by diffusion bonding.

The manufacturing method as described above can both realize the microcrystalline structure with a 50 μm average grain size or less and the random crystal orientation. Further, by using a high-purity tantalum material, it is possible to obtain a tantalum sputtering target having a 99.99% purity or more, a microcrystalline structure, and random crystal orientation. Further, it is possible to form a microcrystalline structure free from ghost grains being the residues of the cast structure. If the ghost grains are present, a place not having the random orientation is partly formed, which is not preferable.

In the measurement of the average crystal grain size, a macrophotograph of a 500 μm×500 μm unit area is taken by optical microphotography and a line intercept method is used. In the line intercept method, an arbitrary straight line (with a 500 μm length) is drawn, the number of Ta crystal grains on the line is counted, and the average crystal grain size is found by (500 μm/the number of crystals on the 500 μm straight line). An average value of the results obtained when this operation is performed three times is defined as the average crystal grain size.

In a sputtering target of an embodiment, a sputtered surface is randomly oriented. Further, this random orientation is maintained throughout the whole thickness direction. Therefore, a sputtering rate does not change during the sputtering, which enables uniform deposition.

As a measuring method of the random crystal orientation, an X-ray diffraction method (XRD) is used. In a target having random orientation, when X-ray diffraction (2θ) of its sputtered surface is measured, peak relative intensities of (110), (211), and (200) planes become smaller in order of (110)>(211)>(200). When the crystal orientation is in a specific direction, the order of the relative intensity ratio of the planes changes. In XRD, as peaks of other planes, those of (220), (310), and (222) planes and so on are also detected, but in order to determine whether the orientation is random or not, it is important to compare the peak relative intensities of the (110), (211), and (200) planes. The reason is that the peaks of these planes are three major peaks with the highest intensities in the PDF (Powder Diffraction File) data.

Further, since the random orientation is maintained throughout the whole thickness direction, when the X-ray diffraction (2θ) is measured in a depth direction of the target, peak relative intensities of the (110), (211), and (200) planes become smaller in order of (110)>(211)>(200) as in the sputtered surface.

Note that the measurement in the X-ray diffraction method is conducted under the condition of a Cu target, a 40 kV tubular voltage, a 40 mA tubular current, a 0.63 mm scattering slit, and a 0.15 mm light-receiving slit. Further, the present/absence of the ghost grains is found also by the aforesaid XRD. When the ghost grains are present, a part not satisfying "(110)>(211)>(200)" is formed. Further, when the ghost grains are present, in a texture photograph taken by an optical microscope (macrophotography), a texture where grain boundaries of Ta crystals are unclear is found.

In the tantalum sputtering target of the embodiment, the random orientation of the sputtered surface is maintained throughout the whole thickness direction. Therefore, even if a thick target having a 10 mm target thickness or more is sputtered for long hours, it exhibits a highly reliable sputtering characteristic that a sputtering rate does not easily change. Further, in the tantalum sputtering target of the embodiment, even if it is a large sputtering target whose sputtered surface has a 300 mm diameter or more, it is possible to maintain the 50 μm average crystal grain size or less and the uniform random orientation. Therefore, it is possible to obtain a uniform state where the Vickers hardness Hv of the sputtered surface falls within a 80 to 110 range and variation in the Vickers hardness is 3% or less.

Specifically, in a large sputtering target whose sputtered surface has a 300 mm diameter or more and whose thickness is 10 mm or more, it is possible to maintain a 50 μm average crystal grain size or less and uniform random orientation of the sputtered surface throughout the whole thickness direction. In addition, residues of ghost grains can be eliminated. Therefore, even if it is used for a long period in a deposition step, the sputtering rate does not easily change, which makes it possible to provide stable sputtering until the thickness of the sputtering target becomes about 2 mm. The sputtering target after used is often reused. Normally, a remaining target is melted into an ingot again, and the ingot is used. To melt tantalum, a high-temperature furnace is necessary because tantalum is a high-melting-point metal, which will be a cause of a cost load. Therefore, an amount of a remaining portion of the target is preferably smaller.

A method for manufacturing a semiconductor element of an embodiment has a step of sputtering by using a tantalum sputtering target. In the method for manufacturing the semiconductor element of the embodiment, the tantalum sputtering target of the above-described embodiment is used as the tantalum sputtering target.

Tantalum is used as tantalum nitride (TaN) for a barrier film of the semiconductor element. Therefore, the sputtering step is preferably performed under a nitrogen-containing atmosphere. Having high reliability in the long-time sputtering, the tantalum sputtering target of the embodiment can improve reliability of the semiconductor element.

EXAMPLES 1 TO 5

Comparative Example 1

Tantalum materials (high-purity tantalum billets with a 99.99 wt % purity or more) each with 100 to 300 mm diameter W×100 to 200 mm thickness H were prepared, and were subjected to the manufacturing steps shown in Table 1. Note that in Table 1, as a working ratio (%), a larger value at least of a reduction in area (%) in a direction of a diameter W and a reduction in thickness (%) in a direction of a thickness H is written. The working ratio is a working ratio per one time (one set), and when the number of times (the number of sets) is two or more, a similar working ratio is adopted. Further, when the number of times (the number of sets) is two or more, a pressure application direction in the direction of the diameter W is alternately changed between perpendicular directions every time (every set) as shown in FIG. 3. Further, Vickers hardness Hv after the first knead forging step was 150 or more both in the examples and the comparative example.

TABLE 1

| | Manufacturing Step | | | | | | |
|---|---|---|---|---|---|---|---|
| | First knead forging | | | Second knead forging | | Cold rolling | |
| | Number of times | Working ratio (%) | First heating (° C. × time) | Number of times | Working ratio (%) | Number of times | Working ratio (%) | Second heating (° C. × time) |
| Example 1 | 2 | 38 | 1200° C. × 3 hours | 2 | 38 | 1 | 85 | 950° C. × 3 hours |
| Example 2 | 4 | 41 | 1200° C. × 3 hours | 1 | 38 | 1 | 91 | 1000° C. × 3 hours |
| Example 3 | 3 | 51 | 1200° C. × 3 hours | 2 | 42 | 1 | 88 | 950° C. × 3 hours |
| Example 4 | 4 | 51 | 1200° C. × 3 hours | 1 | 51 | 1 | 88 | 950° C. × 3 hours |
| Example 5 | 2 | 44 | 1200° C. × 3 hours | 2 | 44 | 1 | 88 | 950° C. × 3 hours |
| Comparative Example 1 | 4 | 32 | 1200° C. × 3 hours | — | | 1 | 88 | 1000° C. × 3 hours |

The tantalum materials having undergone the manufacturing steps in Table 1 were lathed, and sputtering targets with the sizes shown in Table 2 were obtained. An average crystal grain size (μm) and the presence/absence of random orientation in each of the targets were confirmed.

In the measurement of the average crystal grain size, macrophotographs (optical micrographs) of a 500 μm×500 μm unit area in sputtered surfaces and sectional surfaces were taken, and the average crystal grain size (average value on three straight lines) was found by a line intercept method. As for the presence/absence of the random orientation, arbitrary measurement places were selected from the sputtered surfaces and places 10 mm deep from the sputtered surfaces, and X-ray diffraction (2θ) was analyzed. Note that the X-ray diffraction was measured under the conditions of Cu-Kα (target Cu), a 40 kV tubular voltage, a 40 mA current, a 0.63 mm scattering slit, and a 0.15 mm light-receiving slit. The results are shown in Table 2. Note that all the crystal textures were recrystallized.

TABLE 2

| | Target size (Diameter mm × thickness mm) | Average crystal grain size (μm) | Order of relative intensity ratio of X-ray diffraction (Sputtered surface) | |
|---|---|---|---|---|
| | | | Sputtered surface | Surface 10 mm deep from sputtered surface |
| Example 1 | φ320 × 12 t | 37 | (110) > (211) > (200) | (110) > (211) > (200) |
| Example 2 | φ320 × 12 t | 48 | (110) > (211) > (200) | (110) > (211) > (200) |
| Example 3 | φ450 × 6.5 t | 30 | (110) > (211) > (200) | (110) > (211) > (200) |
| Example 4 | φ320 × 12 t | 41 | (110) > (211) > (200) | (110) > (211) > (200) |
| Example 5 | φ450 × 6.5 t | 38 | (110) > (211) > (200) | (110) > (211) > (200) |
| Comparative Example 1 | φ320 × 12 t | 83 | (110) > (200) > (211) | (110) > (200) > (211) |

Next, after backing plates were bonded to the sputtering targets according to the examples or the comparative example by diffusion bonding, sputtering deposition was performed. At this time, the presence/absence of ghost grains on erosion surfaces after the sputtering was confirmed. The sputtering was performed under the condition of a nitrogen atmosphere. The results are shown in Table 3.

TABLE 3

| | Presence/Absence of ghost grain |
|---|---|
| Example 1 | absent |
| Example 2 | absent |
| Example 3 | absent |
| Example 4 | absent |
| Example 5 | absent |
| Comparative Example 1 | present |

In the targets according to the examples, no ghost grain being residues of a cast structure was seen on the erosion surfaces after the sputtering, and they exhibited a stable sputtering characteristic. On the other hand, in the target of the comparative example, ghost grains were seen, and this is because a cast structure remains and the random orientation of the sputtered surface is not maintained throughout the whole thickness direction.

As a result, the tantalum sputtering targets according to the examples can exhibit a highly reliable sputtering characteristic. Therefore, it is also possible to improve reliability of semiconductor elements.

Several embodiments of the present invention have been described, but these embodiments are presented as examples only and are not intended to limit the scope of the invention. These novel embodiments can be carried out in various other forms, and various omissions, substitutions, and changes can be made therein without departing from the spirit of the invention. These embodiments and modifications thereof are included in the scope and spirit of the invention and are included in the scopes of the inventions described in the claims and their equivalencies.

According to the method for manufacturing the tantalum sputtering target of the embodiment, it is possible to manufacture one having a stable sputtering characteristic. Therefore, reliability of the semiconductor element can be improved. Further, it is possible to reduce its remnant after the sputtering and to reduce cost for reuse.

Incidentally, while certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A tantalum sputtering target having a 99.99 wt % tantalum purity or more and a 50 μm average crystal grain size or less,
wherein the tantalum sputtering target has a surface to be sputtered, and
wherein, when X-ray diffraction (2θ) of the surface of the tantalum sputtering target is measured, peak relative intensities of (110), (211), and (200) planes become smaller in order of (110)>(211)>(200) which is equal to an intensity order of three major peaks in a Powder Diffraction File of tantalum.

2. The tantalum sputtering target according to claim 1, wherein a thickness is 10 mm or more.

3. The tantalum sputtering target according to claim 1, wherein, when X-ray diffraction (2θ) in a depth direction of the target is measured, peak relative intensities of (110), (211), and (200) planes become smaller in order of (110)>(211)>(200) which is equal to an intensity order of three major peaks in a Powder Diffraction File of tantalum.

4. A method for manufacturing a semiconductor element having a step of sputtering by using a tantalum sputtering target,
wherein the tantalum sputtering target is the tantalum sputtering target according to claim 1.

5. The method for manufacturing the semiconductor element according to claim 4,
wherein the sputtering is performed under a nitrogen-containing atmosphere.

* * * * *